(12) United States Patent
Wu et al.

(10) Patent No.: US 12,426,154 B2
(45) Date of Patent: Sep. 23, 2025

(54) LENS MODULE AND TERMINAL DEVICE

(71) Applicant: Rayprus Technology (Foshan) Co., Ltd., Foshan (CN)

(72) Inventors: Jia-Qi Wu, Jincheng (CN); Jing-Wei Li, Guangdong (CN); Rui Zhang, Jincheng (CN); Ding Feng, Jincheng (CN); Yu-Xiang Yan, New Taipei (TW)

(73) Assignee: Rayprus Technology (Foshan) Co., Ltd., Foshan (CN)

( * ) Notice: Subject to any disclaimer, the term of this patent is extended or adjusted under 35 U.S.C. 154(b) by 76 days.

(21) Appl. No.: 18/596,888

(22) Filed: Mar. 6, 2024

(65) Prior Publication Data
US 2025/0240875 A1    Jul. 24, 2025

(30) Foreign Application Priority Data
Jan. 18, 2024   (CN) .......................... 202420132346.6

(51) Int. Cl.
| | |
|---|---|
| *H05K 1/02* | (2006.01) |
| *G02B 7/02* | (2021.01) |
| *G03B 17/55* | (2021.01) |
| *H04N 23/54* | (2023.01) |
| *H04N 23/55* | (2023.01) |
| *H05K 1/14* | (2006.01) |

(52) U.S. Cl.
CPC .......... *H05K 1/0271* (2013.01); *G03B 17/55* (2013.01); *H04N 23/54* (2023.01); *H04N 23/55* (2023.01); *H05K 1/147* (2013.01); *G02B 7/02* (2013.01); *H05K 2201/10151* (2013.01)

(58) Field of Classification Search
CPC ................ H05K 1/0271; H05K 1/147; H05K 2201/10151; H04N 23/54; H04N 23/55; G03B 17/55; G02B 7/02
USPC ......................................................... 348/374
See application file for complete search history.

(56) References Cited

U.S. PATENT DOCUMENTS

2015/0214416 A1* 7/2015 Ho .................. H10F 39/804
                                                          438/65

FOREIGN PATENT DOCUMENTS

TW            202201671       *  1/2022

* cited by examiner

*Primary Examiner* — Joel W Fosselman
(74) *Attorney, Agent, or Firm* — ScienBiziP, P.C.

(57) ABSTRACT

A lens module includes a circuit board, a reinforcing plate, a photosensitive chip, and a wire. The circuit board is defined a through hole. The reinforcing plate includes a reinforcing portion and a protruding portion. The protruding portion is disposed on a side of the circuit board. The protruding portion is accommodated in the through hole. The photosensitive chip is accommodated in the through hole. The reinforcing plate, the circuit board, and the photosensitive chip are stacked along a direction. The wire is electrically connecting the photosensitive chip to the circuit board. On a side of the reinforcing plate away from the circuit board, the protruding portion is connected to the reinforcing portion through a curved surface, and a projection width of the curved surface along the direction is less than or equal to 0.03 mm. The present disclosure further provides a terminal device.

18 Claims, 7 Drawing Sheets

LENS MODULE AND TERMINAL DEVICE

FIELD

The subject matter herein generally relates to lens, and more particularly, to a lens module and a terminal device.

BACKGROUND

A structural design of the lens module can affect its manufacturing cost. For example, a gold wire is used for electrical connecting a circuit board and a photosensitive chip in the lens module. The length of the gold wire has an impact on the manufacturing cost of the lens module. Therefore, there is a room for improvement in the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 1:
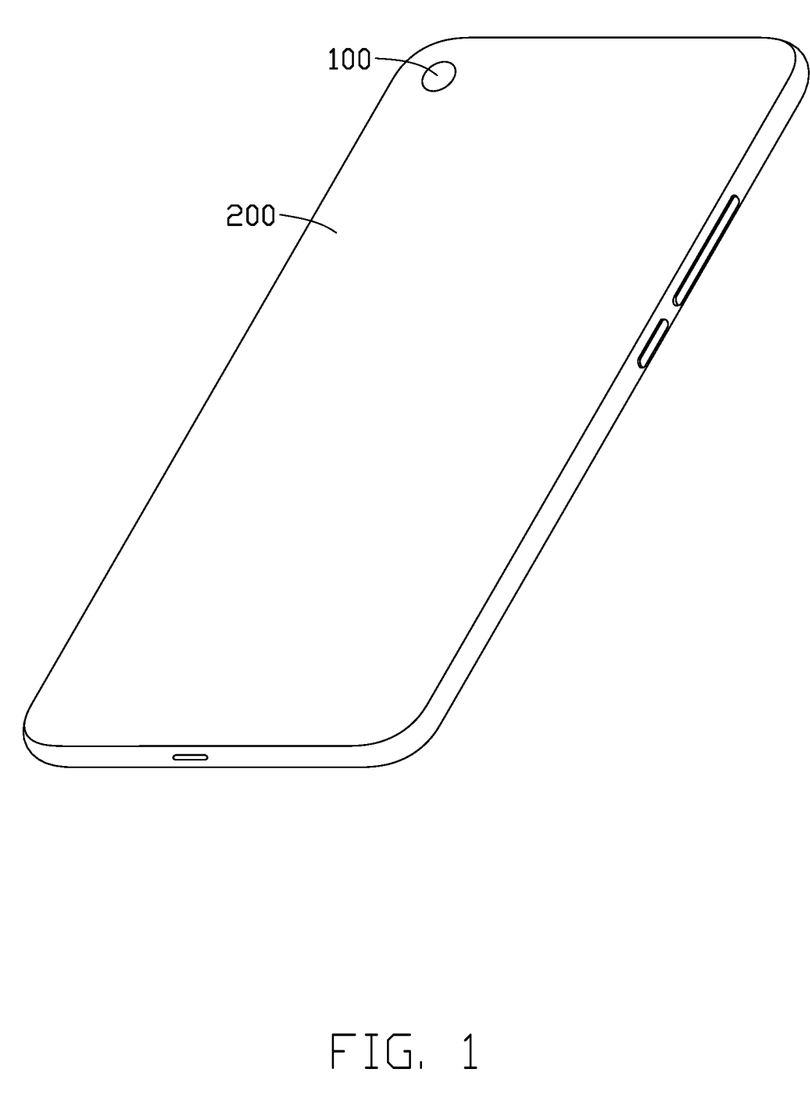
FIG. 1 is a diagrammatic view of an embodiment of a terminal device according to the present disclosure.
Figure 2:
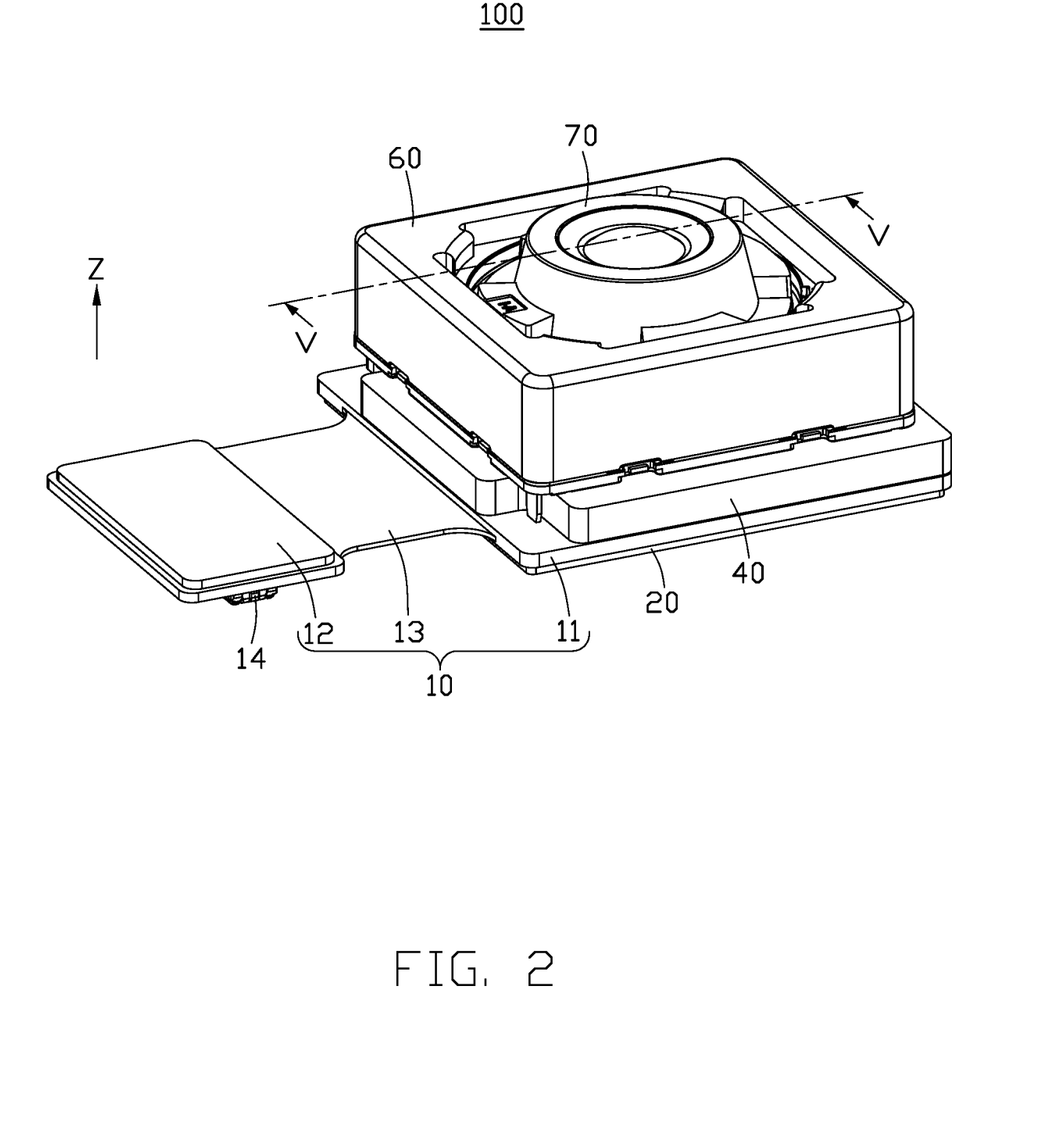
FIG. 2 is a diagrammatic view of an embodiment of a lens module according to the present disclosure.
Figure 3:
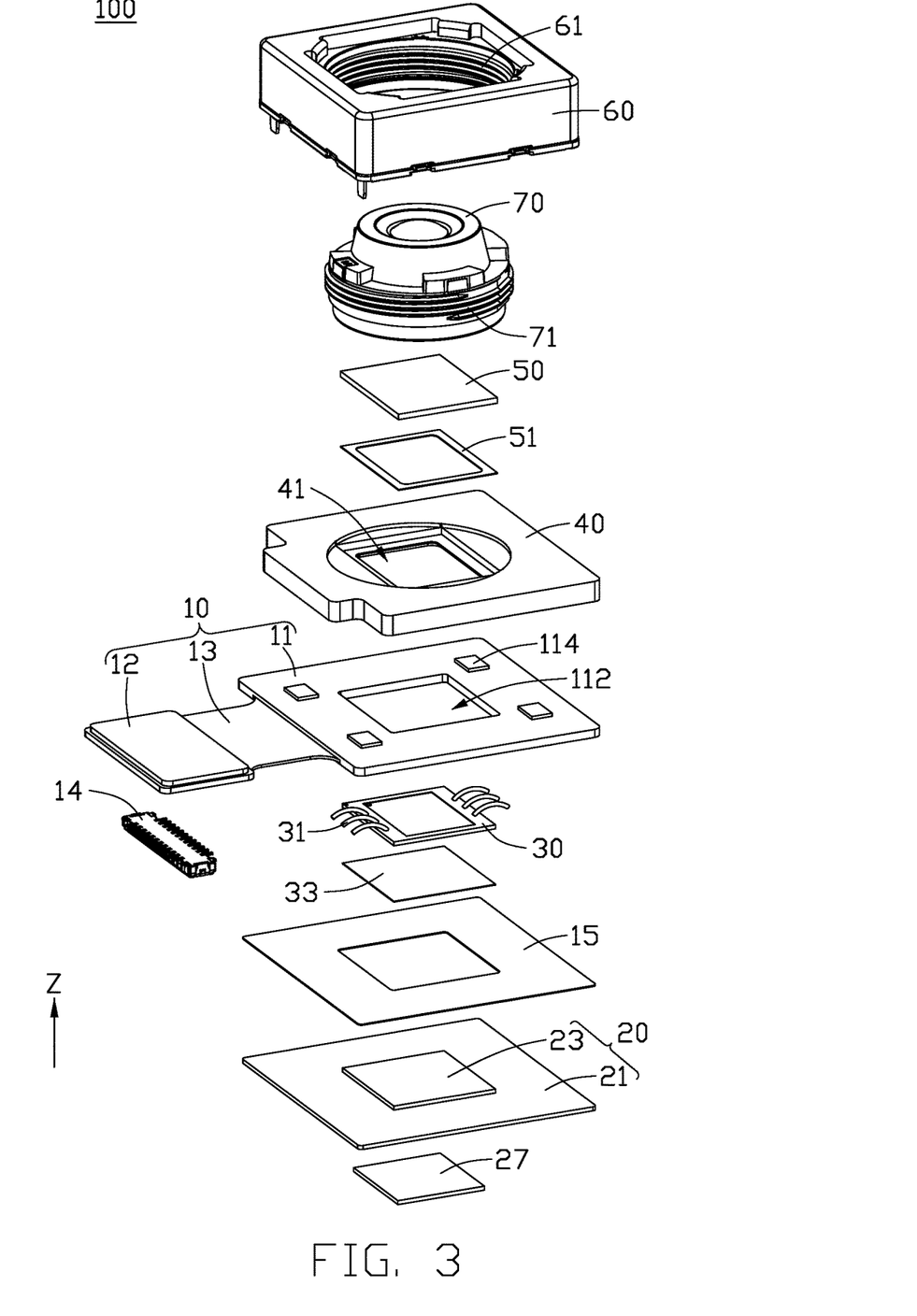
FIG. 3 is an exploded view of the lens module of FIG. 2.
Figure 4:
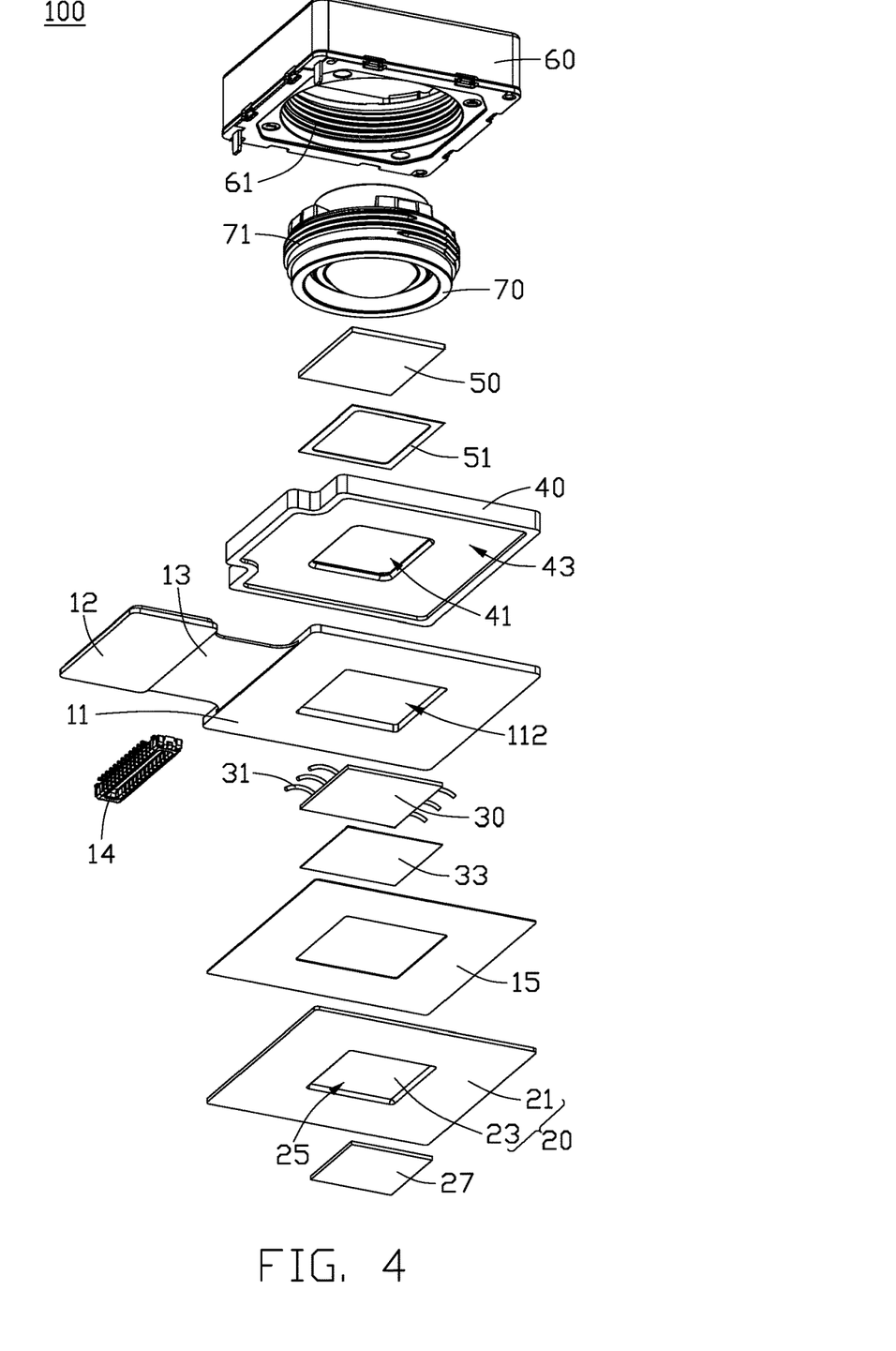
FIG. 4 is similar to FIG. 3, but showing the lens module from another angle.
Figure 5:
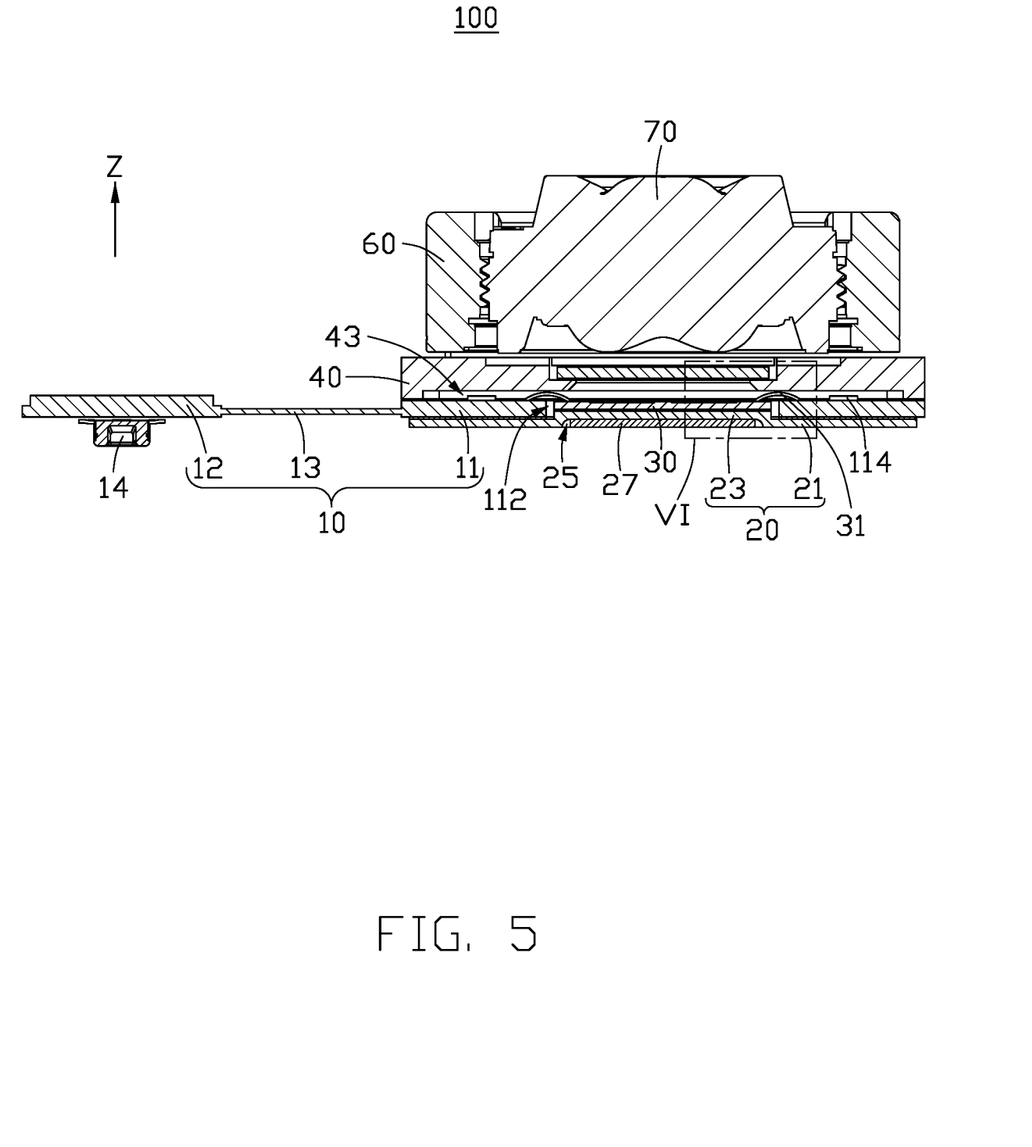
FIG. 5 is a cross-sectional view taken along line V-V of FIG. 2.

Referring to FIG. 1, a terminal device 200 is provided according to an embodiment of the present disclosure. The terminal device 200 is a product with a lens module 100, which can be, but is not limited to, a mobile phone, a camera, a monitor, a drone, etc. The lens module 100 can have zooming and/or anti-shake functions. The lens module 100 can be, but is not limited to a periscope lens, an erecting lens, etc. In the embodiment, the terminal device 200 is a mobile phone, and the lens module 100 is a front camera.

Referring to FIGS. 2 to 5, the lens module 100 includes a circuit board 10, a reinforcing plate 20, a photosensitive chip 30, a carrier 40, a filter 50, a lens holder 60, and a lens 70. The reinforcing plate 20, the circuit board 10, the carrier 40, and the lens holder 60 are disposed from an image side to an object side of the lens module 100 (that is, direction Z). The photosensitive chip 30 is disposed on the circuit board 10, the filter 50 is disposed on the carrier 40, and the lens 70 can be accommodated in the lens holder 60.

The circuit board 10 can be a flexible board, a rigid board, or a rigid-flexible board. In the embodiment, the circuit board 10 is a rigid-flexible board, which includes a first rigid board portion 11, a second rigid board portion 12, and a flexible board portion 13 disposed between the first rigid board portion 11 and the second rigid board portion 12. The lens module 100 further includes an electrical connecting portion 14. The electrical connecting portion 14 is disposed on a surface of the second rigid board portion 12, and can transmit signals between the lens module 100 and other components (not shown) in the terminal device 200. The electrical connecting portion 14 can be a connector or gold fingers. When the circuit board 10 is installed in the terminal device 200, the flexible board portion 13 can be bent to reduce a width of the lens module 100.

A through hole 112 is defined on the first rigid board portion 11. The through hole 112 penetrates through opposite surfaces of the first rigid board portion 11. The through hole 112 is defined substantially in a central area of the first rigid board portion 11. In the embodiment, the through hole 112 is square, in other embodiments, the shape of the through hole 112 may be varied.

The reinforcing plate 20 includes a reinforcing portion 21 and a protruding portion 23, which are integrally formed. The protruding portion 23 is disposed in a central area of the reinforcing portion 21 and protrudes from the reinforcing portion 21. The reinforcing plate 20 can be made of stainless steel.

The reinforcing portion 21 is defined on one side of the first rigid board portion 11, and a first adhesive 15 can be disposed between the reinforcing portion 21 and the first rigid board portion 11. The first adhesive 15 bonds the reinforcing portion 21 and the first rigid board portion 11 together. The reinforcing plate 20 can reinforce the first rigid board portion 11, thereby increasing a strength of the first rigid board portion 11.

The protruding portion 23 is accommodated in the through hole 112. The photosensitive chip 30 is disposed on one side of the protruding portion 23 and accommodated in the through hole 112. A second adhesive 33 is disposed between the photosensitive chip 30 and the protruding portion 23. The A second adhesive 33 bonds the photosensitive chip 30 and the protruding portion 23 together. The sidewalls of the protruding portion 23 and the photosensitive chip 30 are both spaced apart from a sidewall of the first rigid board portion 11 to prevent any collision between the photosensitive chip 30 and the first rigid board portion 11, thereby avoiding damages to the photosensitive chip 30.

The photosensitive chip 30 is electrically connected to the first rigid board portion 11 via a wire 31. The wire 31 connects a surface of the photosensitive chip 30 facing away from the protruding portion 23 and a surface of the first rigid board portion 11 facing away from the reinforcing portion 21. The wire 31 is usually made of gold, which has a relatively high cost.

Figure 6:
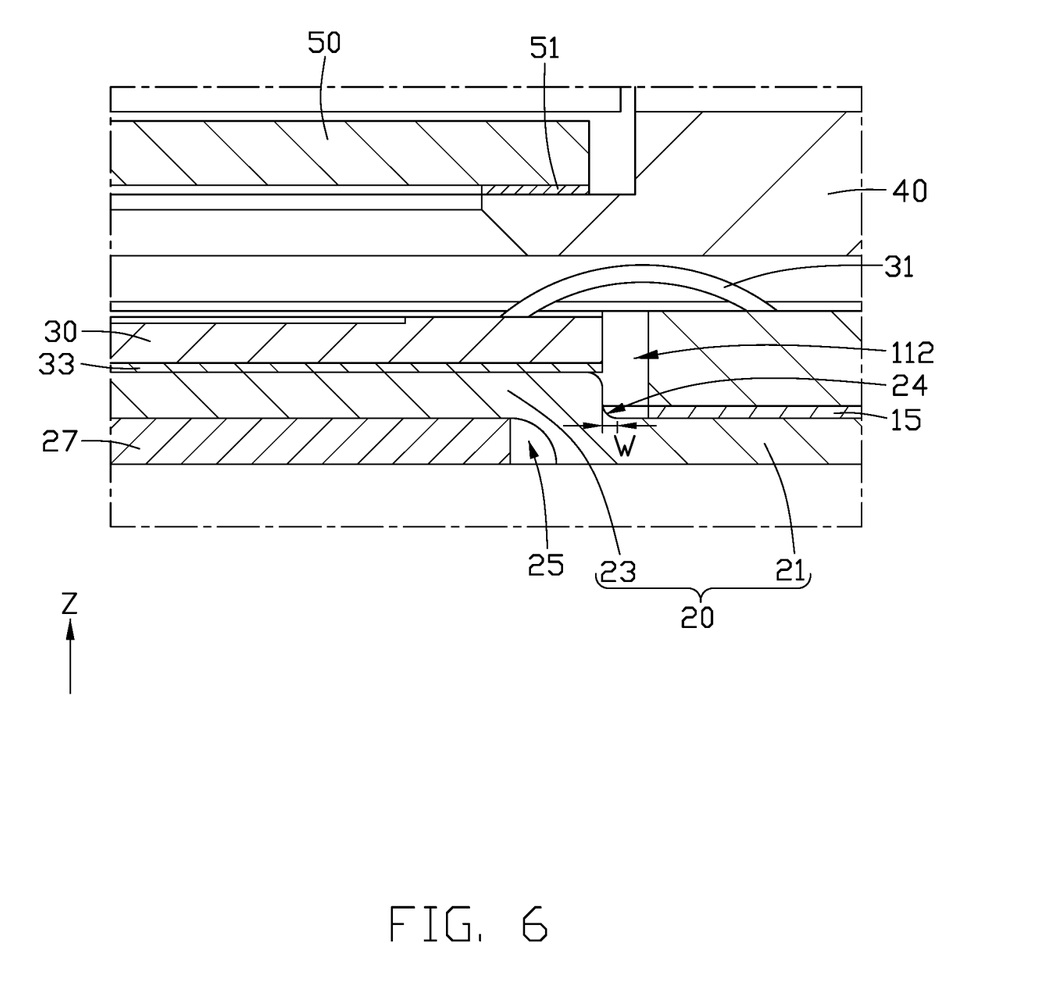
FIG. 6 is a partially enlarged view of an area VI of the lens module in FIG. 5.

Referring to FIG. 6, in the embodiment, the reinforcing plate 20 is formed by a stamping process, for example, by stamping a steel plate to form the reinforcing plate 20 including the reinforcing portion 21 and the protruding portion 23. With the reinforcing plate 20 formed by the stamping process, a width W of an R angle connecting the protruding portion 23 and the reinforcing portion 21 is small. Specifically, on the side of the reinforcing plate 20 facing away from the circuit board 10, the protruding portion 23 and the reinforcing portion 21 are connected by a curved surface 24, and a projection width W of the curved surface 24 along the direction Z is less than or equal to 0.03 mm. For example, the projection width W can be 0.01 mm, 0.02 mm, etc. The smaller the R angle between the protruding portion 23 and the reinforcing portion 21, the smaller the distance between the first rigid board portion 11 and the protruding portion 23, which is beneficial for reducing a length of the wire 31 and then reducing the cost. In addition, forming the reinforcing plate 20 by the stamping process, a height of the protruding portion 23 is easy to adjust. The stamping process is simple to operate, has a short production time, and can also effectively save time and cost.

The reinforcing plate 20 formed by the stamping process further includes a groove 25, which is enclosed and formed by the protruding portion 23 and the reinforcing portion 21. The groove 25 is defined on a side of the protruding portion 23 facing away from the photosensitive chip 30. The groove 25 is formed simultaneously with the protruding portion 23, without adding any extra process.

Figure 7:
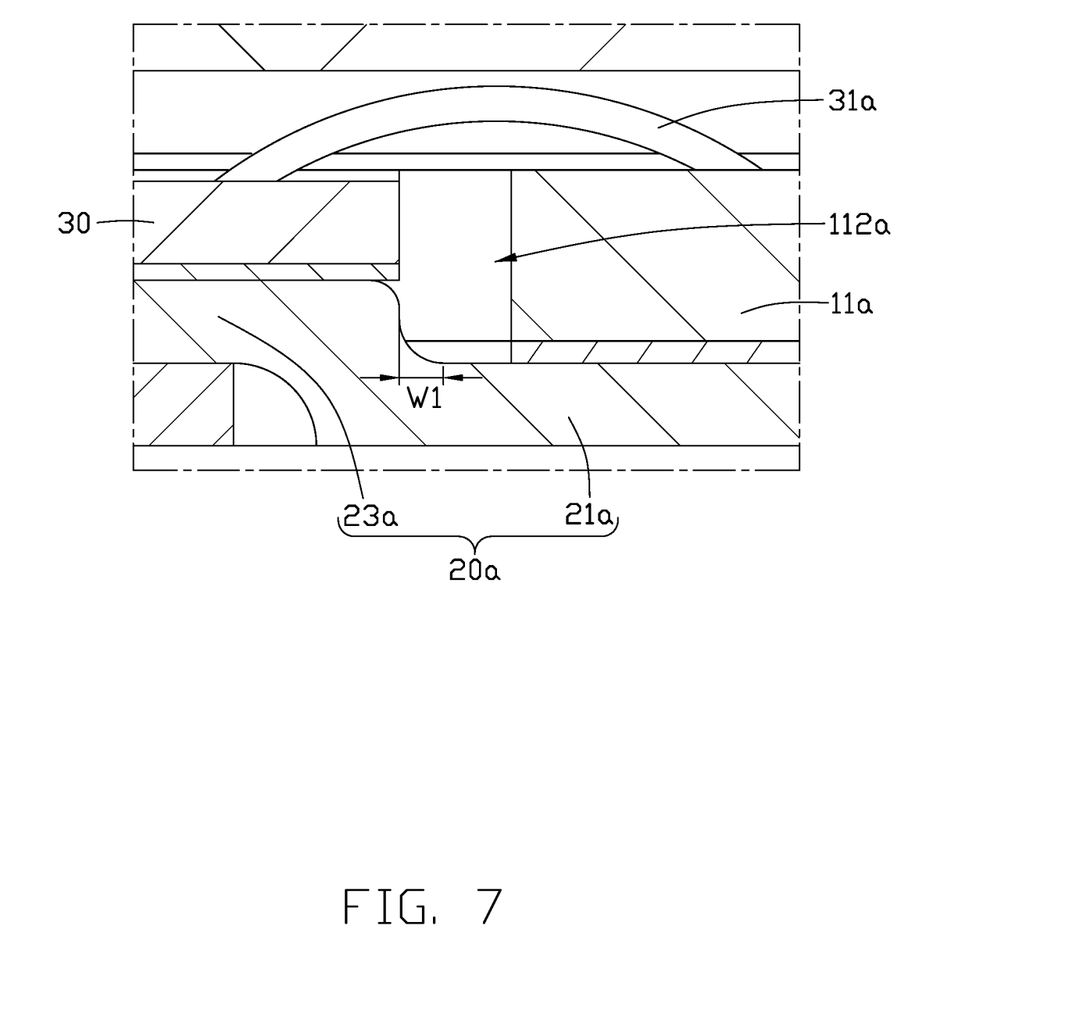
FIG. 7 is a cross-sectional view of another embodiment of a lens module according to the present disclosure.

Referring to FIG. 7, in the embodiment, the lens module 100 further includes a heat sink 27, which can be made of thermally conductive silicone. The heat sink 27 is accommodated in the groove 25 and can be connected to a surface of the protruding portion 23 away from the photosensitive chip 30. When the photosensitive chip 30 generates heat during operation, the heat can be directly transferred to the heat sink 27 through the protruding portion 23 to quickly dissipate the heat and maintain a temperature stability of the photosensitive chip 30 during operation.

In other embodiments, the reinforcing plate 20a can be formed by chemical etching. For example, an area of a steel plate where the protruding portion 23a needs to be formed is masked, and the chemically etched to form a thinned reinforcing portion 21a. The R angle of the reinforcing plate 20a formed by chemical etching is relatively large, usually greater than 0.05 mm. As the height of the protruding portion 23a increases, the R angle will also further increase, and the distance between the first rigid board portion 11a and the protruding portion 23a will correspondingly increase, that is, the width W1 of the through hole 112a will be widened, which will increase the length of the wire 31a and is not conducive to reducing costs. In addition, compared with the stamping process, it is difficult to simultaneously form the groove 25 in the step of forming the protruding portion 23a.

The surface of the first rigid board portion 11 away from the reinforcing portion 21 can also be disposed with other electronic components 114, which can be passive components such as resistors, capacitors, diodes, transistors, relays, electrically erasable programmable read-only memories (EEPROMs), etc.

The carrier 40 is disposed on the surface of the first rigid board portion 11 away from the reinforcing portion 21. The carrier 40 is substantially cuboid-shaped and defined with an accommodating hole 41 penetrating through the carrier 40. The accommodating hole 41 corresponds to a position of the photosensitive chip 30, and the surrounding area of the carrier 40 is disposed on the first rigid board portion 11. An area of the carrier 40 adjacent to the accommodating hole 41 is recessed in a direction away from the first rigid board portion 11 to form an accommodating groove 43. The electronic component 114 is disposed on the surface of the first rigid board portion 11 and accommodated in the accommodating groove 43, so as to reserve a certain safety distance from the carrier 40 without increasing the overall thickness of the lens module 100. In addition, the carrier 40 and the wire 31 are spaced apart from each other, and the position of the carrier 40 does not interfere with the wire 31.

The filter 50 is disposed on the side of the carrier 40 away from the photosensitive chip 30. A third adhesive 51 can be provided between the filter 50 and the carrier 40. The third adhesive 51 bonds the filter 50 and the carrier 40, and the filter 50 and the photosensitive chip 30 are spaced apart from each other. In the embodiment, the optical filter 50 is rectangular, and the third adhesive 51 is annular to be disposed around the filter 50.

The lens holder 60 is disposed on a surface of the carrier 40 away from the circuit board 10. The lens holder 60 is hollow inside and is provided with internal threads 61. The lens 70 is provided with external threads 71 engaged with the internal threads 61. The lens 70 can be accommodated in the lens holder 60 through the internal threads 61 and the external threads 71.

The lens module 100 includes the reinforcing plate 20, which can be formed by a stamping process to form the protruding portion 23 protruding from the reinforcing portion 21. The connection area between the protruding portion 23 and the reinforcing portion 21 forms the curved surface 24 with a smaller R angle, which can reduce the distance between the circuit board 10 and the protruding portion 23, reduce the length of the wire 31, and then reduce the manufacturing cost of the lens module 100. In addition, the stamping process is simple, which can further reduce production costs. Furthermore, when forming the protruding portion 23 by the stamping process, the groove 25 is simultaneously formed, that is, an additional process to form the groove 25 is not needed. The groove 25 can accommodate the heat sink 27, which can improve the heat dissipation performance of the lens module 100 without increasing its height.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A lens module comprising:
   a circuit board defining a through hole;
   a reinforcing plate comprising a reinforcing portion and a protruding portion, the protruding portion protruding from the reinforcing portion, the reinforcing portion disposed on a side of the circuit board, and the protruding portion accommodated in the through hole and spaced apart from the circuit board;
   a photosensitive chip disposed on a side of the protruding portion and accommodated in the through hole, the reinforcing plate, the circuit board, and the photosensitive chip stacked along a direction; and
   a wire disposed a surface of the photosensitive chip facing away from the protruding portion and a surface of the circuit board facing away from the reinforcing portion, the wire electrically connecting the photosensitive chip to the circuit board, wherein, on a side of the reinforcing plate away from the circuit board, the protruding portion is connected to the reinforcing portion through a curved surface, and a projection width of the curved surface along the direction is less than or equal to 0.03 mm.

2. The lens module of claim 1, wherein a groove is defined on the reinforcing plate, the groove is formed by the protruding portion and the reinforcing portion, and the groove is located on a side of the protruding portion facing away from the photosensitive chip.

3. The lens module of claim 2, further comprising a heat sink accommodated in the groove.

4. The lens module of claim 3, wherein the heat sink is made of thermally conductive silicone.

5. The lens module of claim 1, wherein the circuit board further comprises a first rigid board portion, a second rigid board portion, and a flexible board portion disposed between the first rigid board portion and the second rigid board portion, and the through hole is defined on the first rigid board portion.

6. The lens module of claim 5, further comprising a carrier, wherein the carrier is defined on a surface of the first rigid board portion facing away from the reinforcing portion, and the carrier is spaced apart from the photosensitive chip.

7. The lens module of claim 6, wherein the wire connects the photosensitive chip to the first rigid portion, and the wire is spaced apart from the carrier.

8. The lens module of claim 6, wherein the lens module further comprises a filter, the filter is disposed on the carrier facing away from the photosensitive chip and spaced apart from the photosensitive chip.

9. The lens module of claim 1, wherein the reinforcing plate is made of stainless steel.

10. A terminal device comprising:
a lens module comprising:
a circuit board defining a through hole;
a reinforcing plate comprising a reinforcing portion and a protruding portion, the protruding portion protruding from the reinforcing portion, the reinforcing portion disposed on a side of the circuit board, and the protruding portion accommodated in the through hole and spaced apart from the circuit board;
a photosensitive chip disposed on a side of the protruding portion and accommodated in the through hole, the reinforcing plate, the circuit board, and the photosensitive chip stacked along a direction; and
a wire disposed a surface of the photosensitive chip facing away from the protruding portion and a surface of the circuit board facing away from the reinforcing portion, the wire electrically connecting the photosensitive chip to the circuit board, wherein, on a side of the reinforcing plate away from the circuit board, the protruding portion is connected to the reinforcing portion through a curved surface, and a projection width of the curved surface along the direction is less than or equal to 0.03 mm.

11. The terminal device of claim 10, wherein a groove is defined on the reinforcing plate, the groove is formed by the protruding portion and the reinforcing portion, and the groove is located on a side of the protruding portion facing away from the photosensitive chip.

12. The terminal device of claim 11, wherein the lens module further comprises a heat sink accommodated in the groove.

13. The terminal device of claim 12, wherein the heat sink is made of thermally conductive silicone.

14. The terminal device of claim 10, wherein the circuit board further comprises a first rigid board portion, a second rigid board portion, and a flexible board portion disposed between the first rigid board portion and the second rigid board portion, and the through hole is defined on the first rigid board portion.

15. The terminal device of claim 14, wherein the lens module further comprises a carrier, wherein the carrier is defined on a surface of the first rigid board portion facing away from the reinforcing portion, and the carrier is spaced apart from the photosensitive chip.

16. The terminal device of claim 15, wherein the wire connects the photosensitive chip to the first rigid portion, and the wire is spaced apart from the carrier.

17. The terminal device of claim 15, wherein the lens module further comprises a filter, the filter is disposed on the carrier facing away from the photosensitive chip and spaced apart from the photosensitive chip.

18. The terminal device of claim 10, wherein the reinforcing plate is made of stainless steel.

\* \* \* \* \*